United States Patent
Park et al.

(10) Patent No.: US 8,598,710 B2
(45) Date of Patent: Dec. 3, 2013

(54) SEMICONDUCTOR DEVICE WITH DUMMY CONTACTS

(75) Inventors: Yoonmoon Park, Seoul (KR); Jae-Hwang Sim, Seoul (KR); Se-Young Park, Hwaseong-si (KR); Keonsoo Kim, Hwaseong-si (KR); Jaehan Lee, Seoul (KR); Seungwon Seong, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 388 days.

(21) Appl. No.: 12/950,347

(22) Filed: Nov. 19, 2010

(65) Prior Publication Data

US 2011/0115093 A1  May 19, 2011

(30) Foreign Application Priority Data

Nov. 19, 2009  (KR) .......................... 10-2009-0112098

(51) Int. Cl.
  *H01L 23/48* (2006.01)
(52) U.S. Cl.
  USPC ............................ 257/773; 438/618; 438/666
(58) Field of Classification Search
  USPC ........................................................ 257/773
  See application file for complete search history.

(56) References Cited

U.S. PATENT DOCUMENTS

| | | | |
|---|---|---|---|
| 7,199,420 B2 | 4/2007 | Kitamura et al. | |
| 2005/0048729 A1* | 3/2005 | Yoon et al. | ..................... 438/303 |
| 2005/0265100 A1* | 12/2005 | Kitamura et al. | ............. 365/210 |
| 2009/0317749 A1* | 12/2009 | Lee | ............................... 430/319 |

FOREIGN PATENT DOCUMENTS

| | | | |
|---|---|---|---|
| JP | 11-154679 A | | 6/1999 |
| JP | 2005-347334 A | | 12/2005 |
| KR | 2005022699 A | * | 3/2005 |
| KR | 10 2007-0092028 A | | 9/2007 |

* cited by examiner

*Primary Examiner* — Ajay K Arora
(74) *Attorney, Agent, or Firm* — Lee & Morse, P.C.

(57) ABSTRACT

A semiconductor device includes a semiconductor substrate including a cell region and a core region adjacent to the cell region, active regions in the cell region and the core region, an interlayer insulating layer covering the active regions, upper cell contacts penetrating the interlayer insulating layer in the cell region, the upper cell contacts being adjacent to each other along a first direction and being electrically connected to the active regions, and core contacts penetrating the interlayer insulating layer in the active regions of the core region, the core contacts being adjacent to each other along the first direction and including upper connection core contacts electrically connected to the active regions, and dummy contacts adjacent to the upper connection core contacts, the dummy contacts being insulated from the active regions.

15 Claims, 15 Drawing Sheets

SEMICONDUCTOR DEVICE WITH DUMMY CONTACTS

BACKGROUND

1. Field

The present disclosure herein relates to a semiconductor device and a method of forming the same, and more particularly, to a semiconductor device including a cell region and a core region and a method of forming the same.

2. Description of the Related Art

Due to multi-functioning and compactness of electronic equipment, semiconductor devices embedded in the electronic equipment are required to be highly integrated and miniaturized. In order to satisfy these requirements of high integration and miniaturization, components of the semiconductor devices should be reduced in size and be disposed at desired positions. However, it may not be easy to form the components with the reduced size and at the desired positions due to restrictions on facilities and processes.

SUMMARY

Embodiments are therefore directed to a semiconductor device and a method of forming the same, which substantially overcome one or more of the problems due to the limitations and disadvantages of the related art.

It is therefore a feature of an embodiment to provide a semiconductor device optimized for high integration and a method of forming the same.

It is therefore another feature of an embodiment to provide a semiconductor device having improved reliability and a method of forming the same.

At least one of the above and other features and advantages may be realized by providing a semiconductor device, including a semiconductor substrate having a cell region and a core region adjacent to the cell region, active regions in the cell region and the core region, an interlayer insulating layer covering the active regions, upper cell contacts penetrating the interlayer insulating layer in the cell region, the upper cell contacts being adjacent to each other along a first direction and being electrically connected to the active regions, and core contacts penetrating the interlayer insulating layer in the active regions of the core region, the core contacts being adjacent to each other along the first direction and including upper connection core contacts electrically connected to the active regions, and dummy contacts adjacent to the upper connection core contacts, the dummy contacts being insulated from the active regions.

In some embodiments, the semiconductor device may further include at least one interconnection extending in a second direction substantially perpendicular to the first direction, the interconnection connecting the upper cell contacts to the core contacts.

In other embodiments, the interlayer insulating layer may include a first interlayer insulating layer and a second interlayer insulating layer that are sequentially stacked on the semiconductor substrate. The upper cell contacts and the core contacts may penetrate the second interlayer insulating layer.

In still other embodiments, the semiconductor device may further include lower cell contacts and a lower connection core contacts that penetrate the first interlayer insulating layer. The upper cell contacts may electrically be connected to the active regions of the cell region through the lower cell contacts, and the upper connection core contact may electrically be connected to the active regions of the core region through the lower connection core contact. The dummy contact may be insulated from the active regions by the first interlayer insulating layer.

In even other embodiments, each upper surface of the upper cell contacts and the core contacts may be coplanar with an upper surface of the second interlayer insulating layer, and each upper surface of the lower cell contacts may be coplanar with an upper surface of the first interlayer insulating layer.

In yet other embodiments, the semiconductor device may further include contact pads between the first interlayer insulating layer and each of the upper cell contacts and the upper connection core contacts, each contact pad having a larger width than a width of a corresponding upper surface of a lower cell contact or a lower connection core contact.

In further embodiments, each upper connection core contact may be between two dummy contacts along the first direction.

In still further embodiments, the cell contacts may be arranged at a first pitch in the first direction and the core contacts may be arranged at a second pitch in the first direction. The second pitch may be equal to or larger than the first pitch.

In even further embodiments, the active regions may extend in a second direction substantially perpendicular to the first direction, the active regions being adjacent to each other along the first direction, and a plurality of upper connection core contacts may be positioned to contact the adjacent active regions, the upper connection core contacts being adjacent to each other along a third direction nonparallel to the first or second directions.

In yet further embodiments, a cross-section of the upper cell contacts and the core contacts may have a circular or an oval shape, the cross-section being along a plane parallel to a surface supporting the semiconductor substrate.

In yet further embodiments, the upper cell contacts may have a substantially same width in the first direction as the core contacts.

At least one of the above and other features and advantages may also be realized by providing a method of forming a semiconductor device, including defining active regions in a semiconductor substrate including a cell region and a core region adjacent to the cell region, the active regions traversing the cell region and the core region; forming a first interlayer insulating layer on the active regions; forming lower cell contacts that come in contact with the active regions of the cell region and are arranged in a first direction so as to penetrate the first interlayer insulating layer and lower connection core contacts that come in contact with the active regions of the core region and are arranged in the first direction so as to penetrate the first interlayer insulating layer; forming a second interlayer insulating layer on the first interlayer insulating layer; and forming upper cell contacts that are arranged in the first direction so as to be electrically connected to the active regions through the lower cell contacts and upper core contacts that are arranged in the first direction. The upper core contacts and the upper core contacts may be disposed in the second interlayer insulating layer. The upper core contacts may include an upper connection core contact that is electrically connected to the lower connection core contacts and dummy contacts that are insulated from the active regions by the first interlayer insulating layer.

In some embodiments, the lower cell contacts and the upper cell contacts may be arranged at a first pitch and the core contacts may be arranged at a second pitch. The second pitch may be equal to or larger than the first pitch.

In other embodiments, the forming of the upper cell contacts and the upper core contacts may include forming a photoresist and a mask on the second interlayer insulating layer. The mask may include patterns for forming the upper cell contacts and the upper core contacts. The patterns for forming the upper cell contacts may substantially have the same pitch in the first direction as the patterns for forming the upper core contacts.

In still other embodiments, the forming of the upper cell contacts and the upper core contacts may include forming contact holes that penetrate the second interlayer insulating layer and filling a conductive material in the contact holes. The contact holes of the cell region expose the lower cell contact and the first interlayer insulating layer of the core region.

In even other embodiments, the method may further include forming interconnections, which extend in a second direction intersecting the first direction, on the upper cell contacts and the upper core contacts. The active regions may extend in the second direction, and the interconnections may electrically connect the upper cell contacts and the upper core contacts on one active region.

In yet other embodiments, the method may further include forming cell contact pads on the lower cell contact and core contact pads on the core region. The forming of the upper cell contacts and the upper core contacts may include forming contact holes that penetrate the second interlayer insulating layer. The contact holes of the cell region may expose the cell pads and the contact holes of the core region may expose the first interlayer insulating layer.

In further embodiments, the upper cell contacts and the upper core contacts may be formed at the same time to have the same width along the first direction.

In still further embodiments, the method may further include forming other upper core contacts arranged in parallel with the upper core contacts arranged in the first direction. The upper connection core contacts of the upper core contacts are arranged on the first interlayer insulating layer in a direction non-vertical and nonparallel to the first direction.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1A:
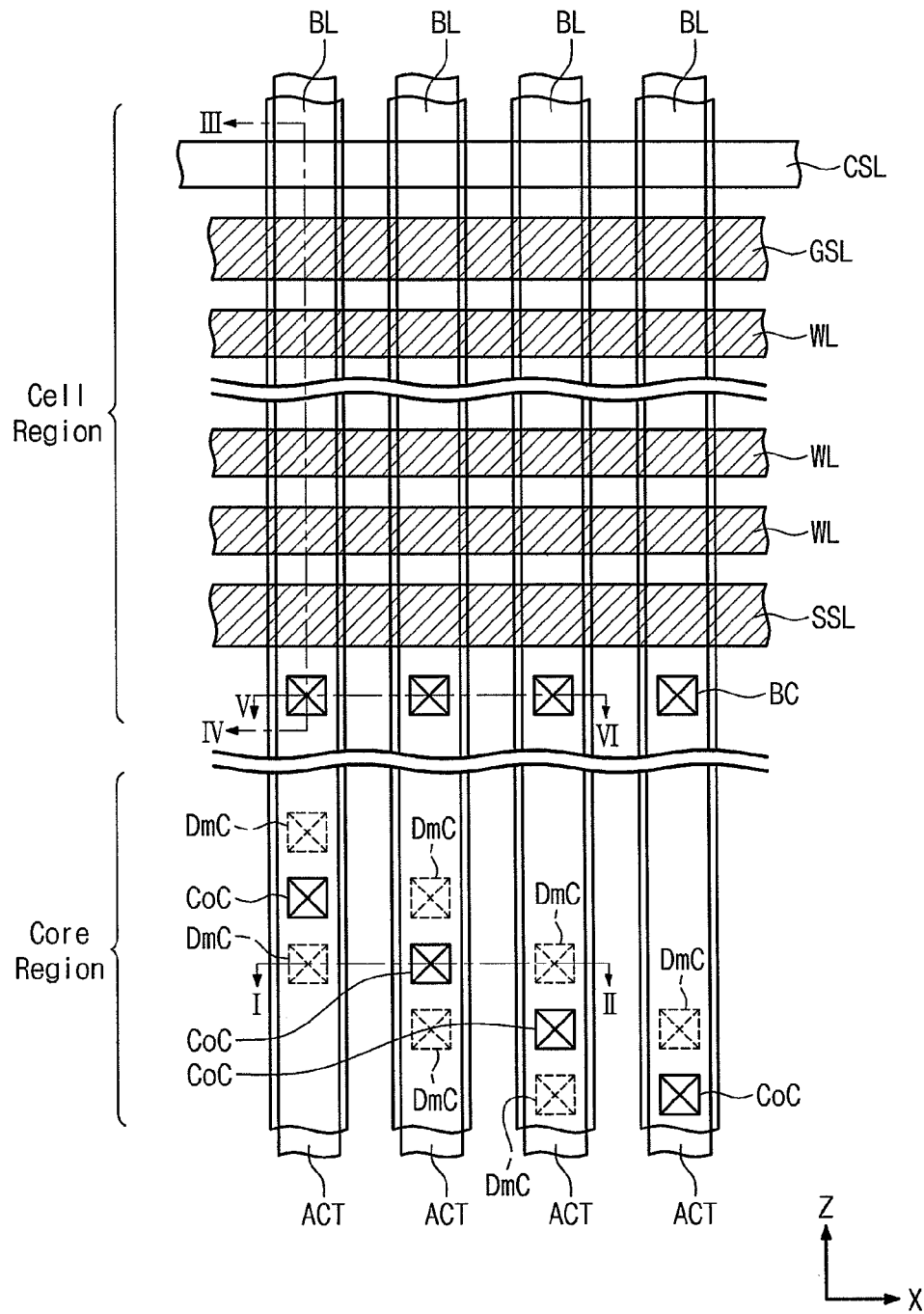
FIG. 1A illustrates a plan view of a semiconductor device according to one embodiment of the inventive concept.

Korean Patent Application No. 10-2009-0112098, filed on Nov. 19, 2009, in the Korean Intellectual Property Office, and entitled: "Semiconductor Device and Method of Forming the Same," is incorporated by reference herein in its entirety.

A semiconductor device and a method of forming the same according to embodiments of the inventive concept may be understood more readily by reference to the following detailed description of preferred embodiments and the accompanying drawings. The exemplary embodiments of the inventive concept may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when an element or layer is referred to as being "on" another element or layer, it may be directly on the other element or layer or intervening elements or layers may be present. It will also be understood that when a layer is referred to as being "between" two layers, it can be the only layer between the two layers, or one or more intervening layers may also be present. Like reference numerals refer to like elements throughout.

As used herein, the terms "and/or" is intended to include any and all combinations of one or more of the associated listed items. In addition, it will be understood that, although the terms first, second, third, etc. may be used herein to clearly describe various elements, components, regions, layers, and/or sections, these elements, components, regions, layers, and/or sections should not be limited by these terms. It will be understood that, although the terms upper, lower, etc. may be used herein to clearly describe various elements, components, regions, layers, and/or sections, these elements, components, regions, layers, and/or sections should not be limited by these terms.

Figure 8A:
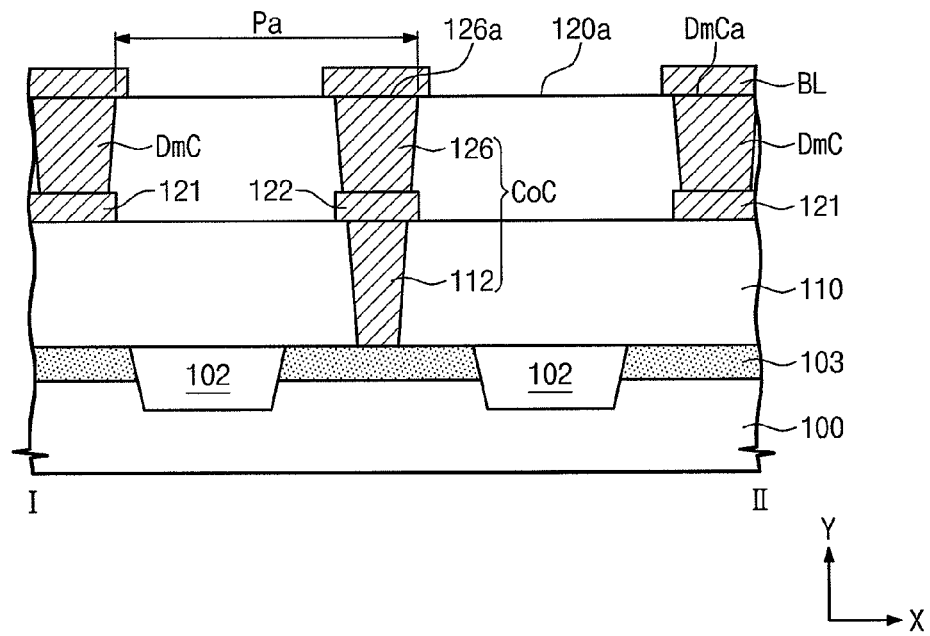
FIGS. 8A through 8C illustrate cross-sectional views of another stage in a manufacturing method of the semiconductor device taken along respective lines I-II, and V-VI in FIGS. 1A and 2A.
Figure 8B:
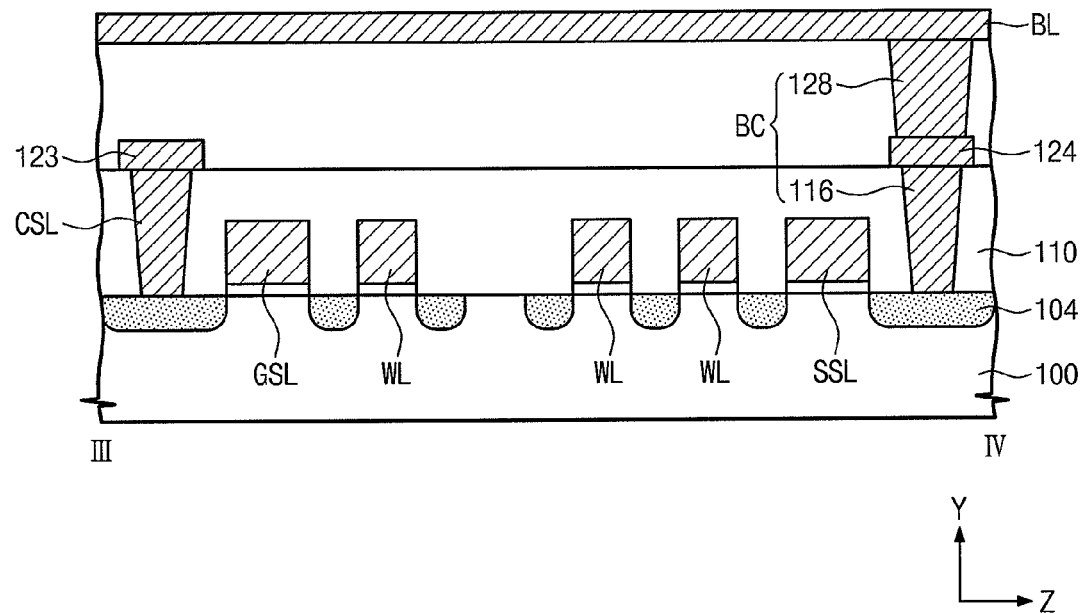
Figure 8C:
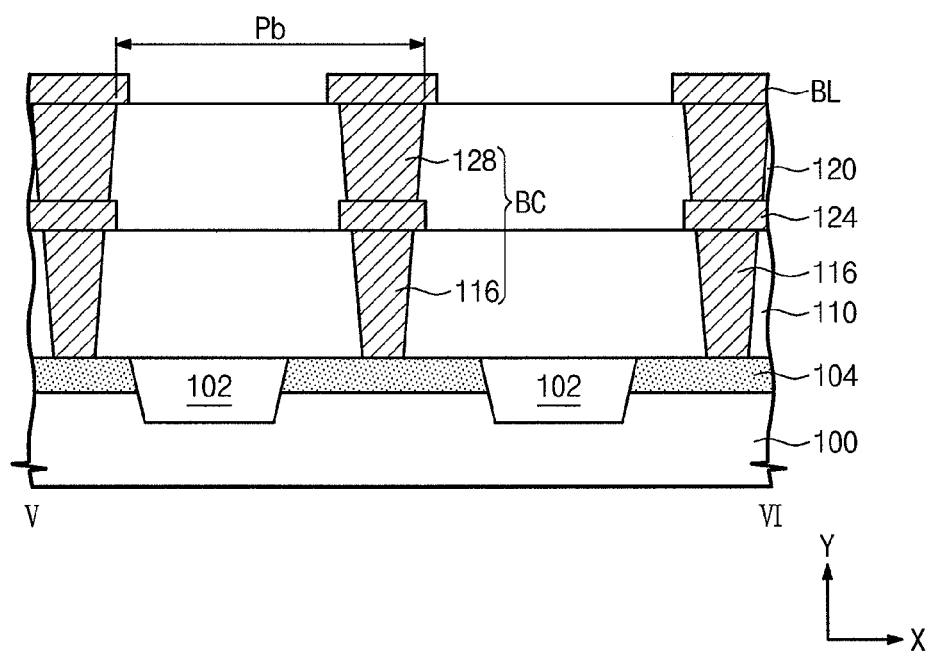

With reference to FIGS. 1A and 8A through 8C, a semiconductor device according to one embodiment of the inventive concept will be described. FIG. 1A illustrates a plan view of a semiconductor device according to one embodiment of the inventive concept. FIGS. 8A through 8C illustrate cross-sectional views of the semiconductor device taken along respective lines I-II, and V-VI of FIG. 1A.

Referring to FIGS. 1A and 8A through 8C, a plurality of active regions ACT may be defined on a semiconductor substrate 100. The semiconductor substrate 100 may include a cell region, a core region, and a peripheral region (not illustrated). The cell region may be a region where a cell array of the semiconductor device may be disposed, and the core region may be a region for coding data to the cell array or decoding data from the cell array. The peripheral region may be a region for supplying voltage to cells of the cell region and/or the core region. The core region may be disposed at an edge of the cell region and/or be disposed between a plurality of cell regions. The peripheral region may be disposed outside a prescribed region including the cell region and the core region.

The active regions ACT may traverse the cell region and the core region. The active regions ACT may be defined by device isolation layers 102 on the semiconductor substrate 100. As illustrated in FIG. 1A, the active regions ACT may extend along a first direction, e.g., along the z-axis, of the semiconductor substrate 100. Well regions doped with first conductive-type dopants may be disposed in the active regions ACT of the cell region and the core region. Cell impurity regions 104 and core impurity regions 103 may be disposed in the active regions ACT of the cell and core regions, respectively. The impurity regions 103 and 104 may be regions doped with second conductive-type dopants opposite to the first conductive-type dopants.

A ground selection line GSL, wordlines WL, and a string selection line SSL may be disposed on the active region ACT between the cell impurity regions 104 of the cell region. As illustrated in FIG. 8B, a plurality of wordlines WL may be disposed between one ground selection line GSL and one string selection line SSL. A pair of adjacent wordlines WL in a second direction, e.g., along the x-axis, may share one impurity region 104. The wordlines WL disposed at both ends may share one impurity region 104 with the ground selection line GSL or string selection line SSL adjacent to the wordlines WL in the first direction.

As illustrated in FIGS. 8A-8C, a first interlayer insulating layer 110 may be disposed on the semiconductor substrate 100 including the active regions ACT. The first interlayer insulating layer 110 may cover the entire surface of the cell region and the core region. The first interlayer insulating layer 110 may be formed of at least one material including oxides and/or nitrides. The first interlayer insulating layer 110 may cover the ground selection line GSL, the wordlines WL, and the string selection line SSL.

Referring to FIGS. 8B-8C, a lower bitline contact 116 may be disposed in the cell region to penetrate the first interlayer insulating layer 110. The lower bitline contact 116 may be electrically connected to the impurity region 104 adjacent to the string selection line SSL. In addition, a common source line CSL may be disposed to penetrate the first interlayer insulating layer 110 of the cell region. The common source line CSL may be electrically connected to the impurity region 104 adjacent to the ground selection line GSL. The common source line CSL may have a same height as the lower bitline contact 116, e.g., as measured between upper and lower surfaces of the contact. For example, the upper surface of the lower bitline contact 116 may be larger in width than the lower surface of the lower bitline contact 116. In another example, the upper surface of the lower bitline contact 116 may have a substantially same width as the lower surface of the lower bitline contact 116.

Referring to FIG. 8A, a lower connection core contact 112 may be disposed at the core region to penetrate the first interlayer insulating layer 110. The lower connection core contact 112 may be electrically connected to the impurity region 103 disposed in the active region ACT of the core region. The core impurity region 103, which is electrically connected to the lower connection core contact 112, may be source/drain region of a core transistor (not illustrated). In one embodiment of the inventive concept, one active region ACT may be electrically connected to one lower connection core contact 112 at the core region adjacent to one side of the cell region.

For example, a width of an upper surface of the lower connection core contact 112 may be relatively larger than a width of a lower surface of the lower connection core contact 112. In another example, the upper surface of the lower connection core contact 112 may have a substantially same width as the lower surface of the lower connection core contact 112. The lower connection core contact 112 may have a substantially same height as the common source line CSL and the lower bitline contact 116.

A second interlayer insulating layer 120 may be disposed on the first interlayer insulating layer 110. The second interlayer insulating layer 120 may cover the entire surface of the first interlayer insulating layer 110. The second interlayer insulating layer 120 may be a single layer or multiple layers.

Core contacts may be disposed in the core region to penetrate the second interlayer insulating layer 120. As further illustrated in FIGS. 1A and 8A, the core contacts may include upper connection core contacts 126 and dummy contacts DmC. The upper connection core contacts 126 may be electrically connected to the active regions ACT of the core region, and the dummy contacts DmC may be adjacent to the upper connection core contacts 126. For example, as illustrated in FIG. 1A, the dummy contacts DmC may be adjacent to an upper connection core contact 126 along the first direction, i.e., along the z-axis, within a same active region ACT, and the dummy contacts DmC may be adjacent to the upper connection core contact 126 along the second direction, e.g., along the x-axis, when in different active regions ACT. For example, one upper connection core contact 126 may be between two adjacent dummy contacts DmC along the first direction and/or along the second direction.

The upper connection core contact 126 and the lower connection core contact 112 may be electrically and vertically connected to each other, thereby forming a connection core contact CoC electrically connected to the active region ACT. That is, as illustrated in FIG. 8A, the upper connection core contact 126 may be positioned on the lower connection core contact 112, so the lower connection core contact 112 may be between the semiconductor substrate 100 and the upper connection core contact 126.

The dummy contacts DmC may be insulated from the active region ACT of the core region by the first interlayer insulating layer 110. For example, a lower surface of the dummy contact DmC may have a same height as an upper surface of the first interlayer insulating layer 110. In other words, the dummy contact DmC may be directly on the first interlayer insulating layer 110, so the lower surface of the dummy contact DmC may contact the upper surface of the first interlayer insulating layer 110. In another example, the lower surface of the dummy contact DmC may be higher than the upper surface of the first interlayer insulating layer 110, so another element, e.g., dummy pads 121, may be positioned between the lower surface of the dummy contact DmC and the upper surface of the first interlayer insulating layer 110.

The upper connection core contact 126 and the dummy contacts DmC may have substantially same structures, e.g., in terms of dimensions and/or shape. For example, heights of the upper connection core contact 126 and the dummy contacts DmC may be substantially equal to each other, so upper surfaces 126a and DmCa of the upper connection core contact 126 and the dummy contacts DmC, respectively, may be substantially coplanar and lower surfaces of the upper connection core contact 126 and the dummy contacts DmC may be substantially coplanar. Further, the upper surfaces 126a and DmCa of the upper connection core contact 126 and the dummy contacts DmC may be substantially coplanar with an upper surface 120a of the second interlayer insulating layer 120. In another example, cross-sections of the upper connection core contact 126 and the dummy contacts DmC, i.e., cross section along planes parallel to the plane of the semiconductor substrate 100, may be a circle, an oval, or a rectangle. When cross-sections of the upper connection core contact 126 and the dummy contacts DmC, which are parallel to the plane of the semiconductor substrate 100, are rectangular, the edge of the rectangle may be rounded.

The dummy contacts DmC may be disposed at one side or both sides of the upper connection core contact 126 in the second direction. In one embodiment of the inventive concept, a plurality of dummy contacts DmC may be disposed at one side and the other side of the upper connection core contact 126. For example, the core contacts may be configured with one upper connection core contact 126 foamed at the center, two or more dummy contacts DmC formed at one side, and two or more dummy contacts DmC formed at the other side, thereby forming one core contact column in the second direction, i.e., along the x-axis. That is, an alignment along the second direction of one connection core contact 126 between two pairs of dummy contacts DmC may define one core contact column in the second direction. In another example, one upper connection core contact 126 formed at the center and one dummy contact DmC formed at one side may define one core contact column in the second direction. The core contacts may be arranged at a first pitch Pa in the second direction, as illustrated in FIG. 8A.

A plurality of core contact columns may be disposed on the semiconductor substrate 100 of the core region. The core contact columns may extend along the second direction in parallel to each other, and may be spaced apart from each other along the first direction. Adjacent active regions ACT extending in the first direction may be electrically connected to upper connection core contacts 126 of adjacent core contact columns. For example, a first active region ACT may be connected to an upper connection core contact 126 of a first core contact column, and a second active region ACT, i.e., adjacent to the first active region ACT along the second direction, may be connected to an upper connection core contact 126 of a second core contact column, i.e., adjacent to the first core contact column in the first direction. The upper connection core contacts 126 in the plurality of the core contact columns may be arranged in a third direction not parallel to the first or second direction, e.g., a diagonal direction, and may be electrically connected to the active regions ACT of the core region.

The lower connection core contacts 112, which are electrically connected to the upper connection core contacts 126, may also be arranged on the active regions ACT in the same manner as the upper connection core contacts 126. The core connection contacts CoC, which come in contact with the plurality of active regions ACT, may be arranged in a non-parallel direction to the second direction (where the wordlines WL extend) and the first direction (where bitlines extend). The dummy contacts DmC may be adjacent to the upper connection core contacts 126 in the first direction and/or the second direction.

Figure 1B:
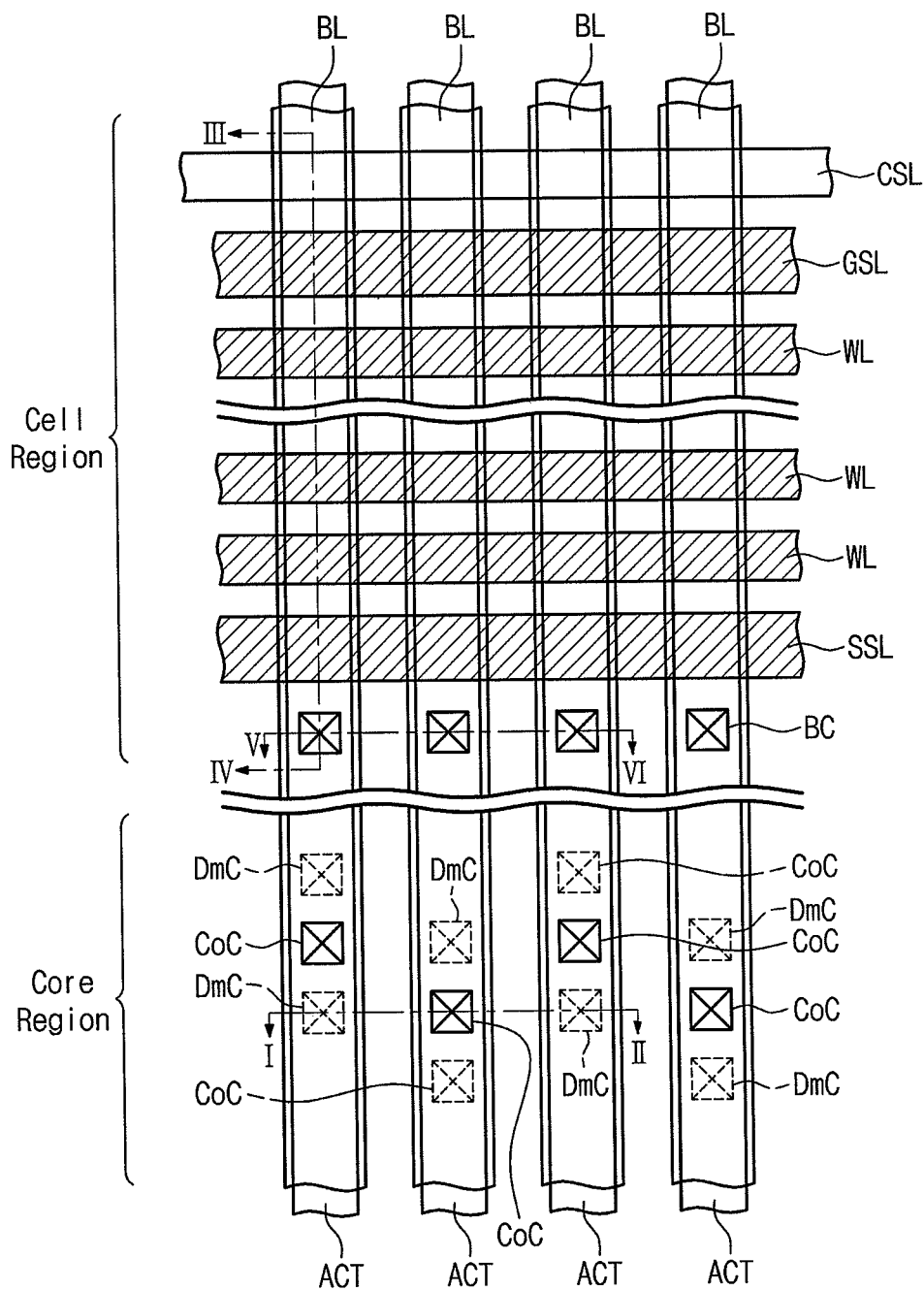
FIG. 1B illustrates a plan view of a semiconductor device according to a modified embodiment of the inventive concept.

It is noted that the arrangement of the core contacts is not limited to the arrangement described previously with reference to FIG. 1A. For example, as illustrated in FIGS. 1B and 2B, the core contacts may be arranged in the first direction, and core contact rows including at least one of the dummy contact DmC and the core contact CoC may be disposed in a form of zigzag.

As illustrated in FIG. 8A, connection contact pads 122 may be interposed between the upper connection core contacts 126 and the lower connection core contacts 112. The connection contact pads 122 may be disposed to make a stable connection between the upper connection core contacts 126 and the lower connection core contacts 112. The connection contact pads 122 may have wider upper surfaces than those of the lower connection core contacts 112. For example, in an implementation, the connection contact pads 122 may be omitted.

As further illustrated in FIG. 8A, dummy pads 121 may be disposed at the lower portion of the dummy contacts DmC. The dummy pads 121 may have the same width as the connection contact pads 122. The dummy pads 121 may be electrically insulated from the active regions ACT by the first interlayer insulating layer 110. For example, in an implementation, the dummy pads 121 may be omitted.

Referring to FIGS. 8B and 8C, upper bitline contacts 128 may be disposed in the cell region to penetrate the second interlayer insulating layer 120. The upper bitline contacts 128 may be electrically connected to the lower bitline contacts 116. The upper bitline contacts 128 may be electrically connected to the active regions ACT of the cell region by the lower bitline contacts 116. The upper bitline contacts 128 and the lower bitline contact 116 may be vertically connected to each other, thereby forming a bitline contact BC. The upper and lower bitline contacts 116 and 128 may be a circle, an oval, or a rectangle having rounded edges. For example, widths of the upper and lower bitline contacts 116 and 128 may be substantially equal to those of the core contacts in the second direction. When the widths of the bitline contacts BC and the core contacts are substantially equal to each other in the second direction, a margin between the core contacts and the active region may be improved.

In contrast, when the width of the core contacts is larger than that of the bitline contacts BC in the second direction, the core contacts may be connected to the adjacent active region ACT due to misalignment. As such, the semiconductor device may be unable to execute its original functions. Therefore, according to embodiments of the inventive concept, when the core contacts have the same width as the bitline contacts BC in the second direction, the margin between one connection core contact CoC and the active region ACT adjacent thereto in the second direction may be improved. As a result, the reliability of the device may be improved. It is noted that the width of each of the core contacts and the bitline contacts BC is measured in a second direction, i.e., x-axis, along a corresponding upper surface, i.e., where an upper surface of a corresponding core contact or a bitline contact BC is substantially coplanar with the upper surface 120a of the second interlayer insulating layer 120.

The plurality of bitline contacts BC may be arranged in a row in the second direction, as illustrated in FIG. 1A. The bitline contacts BC may be disposed at a second pitch Pb on the active regions ACT, as illustrated in FIG. 8C. The second pitch Pb may be substantially equal to or smaller than the first pitch Pa of the core contacts.

Figure 2A:
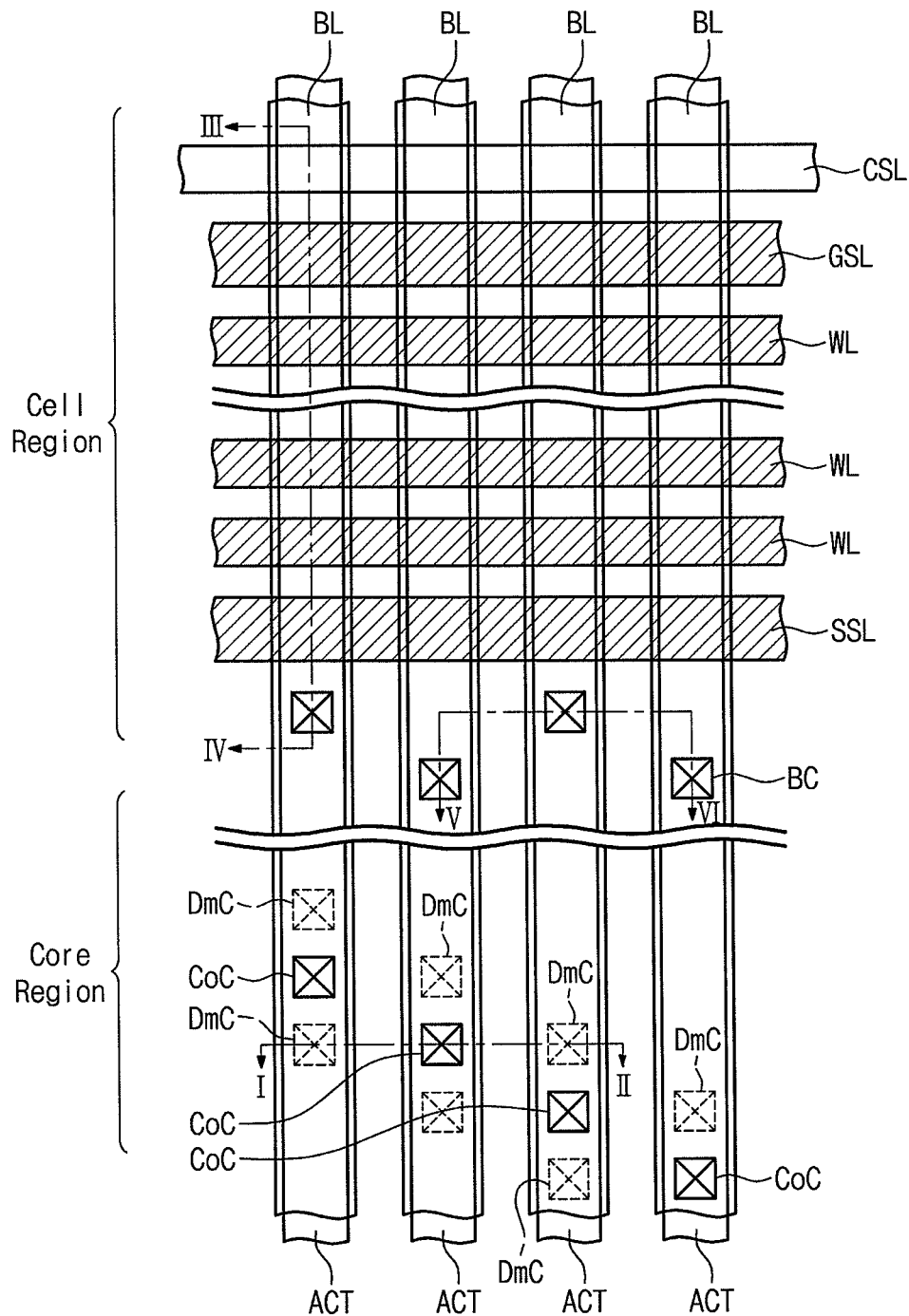
FIG. 2A illustrates a plan view of a semiconductor device according to another embodiment of the inventive concept.
Figure 2B:
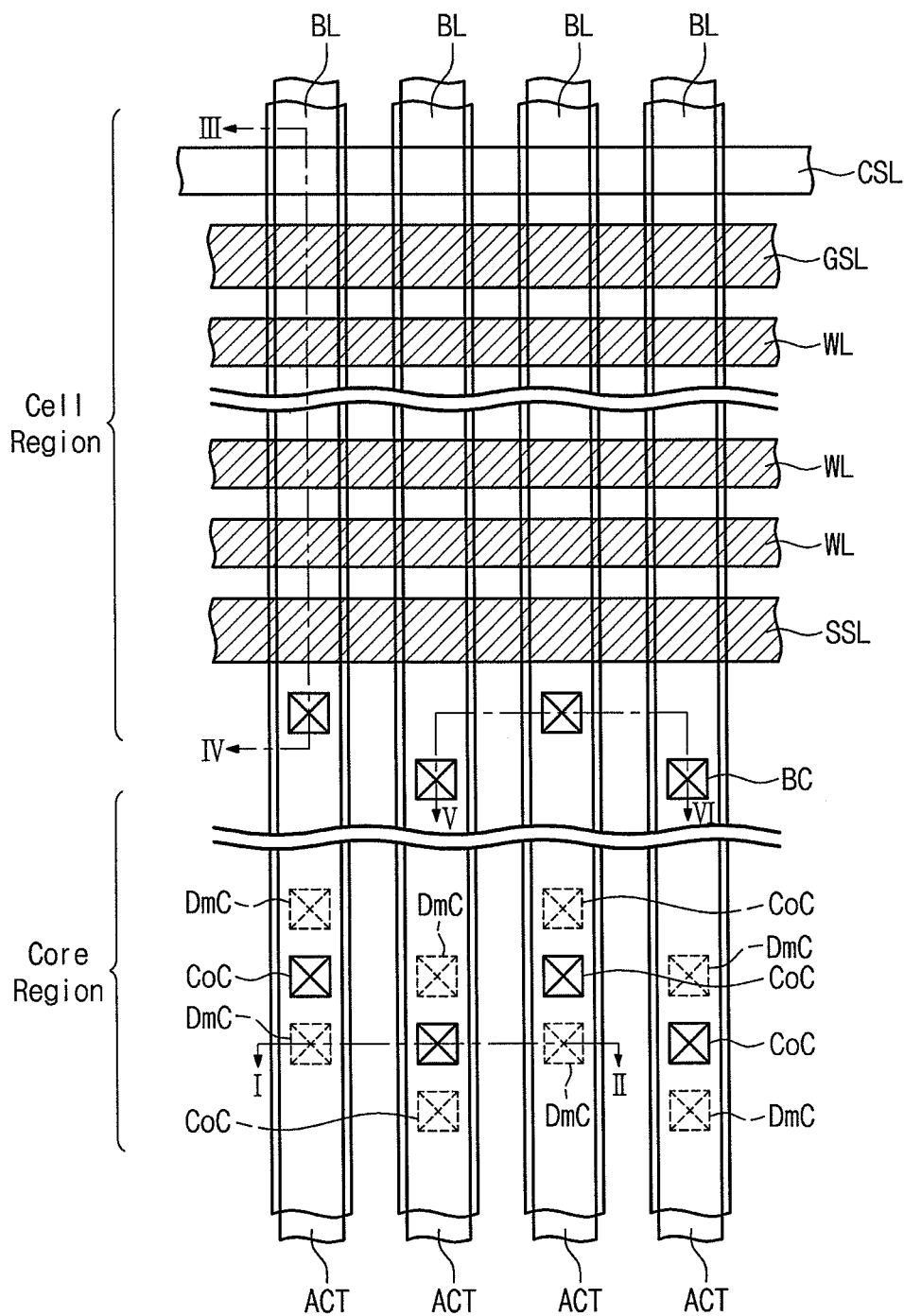
FIG. 2B illustrates a plan view of a semiconductor device according to another modified embodiment of the inventive concept.

According to another embodiment, as illustrated in FIGS. 2A and 2B, the bitline contacts BC may be arranged in a plurality of parallel rows, such that bitline contacts BC on adjacent active regions ACT may not be adjacent to each other in the second direction. For example, the bitline contacts BC may be disposed in the form of zigzag on the active regions ACT of the cell region. However, the arrangement of the bitline contacts BC is not limited to the configurations illustrated in FIGS. 1A and 2A and may be arranged in various forms.

As further illustrated in FIGS. 8B and 8C, bitline contact pads 124 may be interposed between the upper bitline contacts 128 and the lower bitline contacts 116. Through the bitline contact pads 124, the upper bitline contacts 128 may be electrically connected to the lower bitline contacts 116. The upper surfaces of the bitline contact pads 124 may be wider in area than the upper surfaces of the lower bitline contacts 116. Accordingly, the upper bitline contacts 128 may be stably connected to the lower bitline contacts 116. Alternatively, the bitline contact pads 124 may be omitted. A common source pad 123 may be formed on the common source line CSL. Alternatively, the common source pad 123 may be omitted.

Bitlines BL may be disposed on the second interlayer insulating layer 120 of the cell region. The bitlines BL may extend in the first direction. The bitlines BL may be electrically connected to the bitline contacts BC, and may be electrically connected to the cell impurity region 104 through the bitline contacts BC.

The bitlines BL may extend onto the second interlayer insulating layer 120 of the core region. As illustrated in FIG. 8A, the extended bitlines BL may be electrically connected to the core connection contacts CoC. In addition, the extended bitlines BL may be electrically connected to the dummy contacts DmC adjacent to the core connection contacts CoC in the first direction. The extended bitlines BL may be connected to the dummy contacts DmC, but may be insulated from the active regions ACT below the dummy contacts DmC by the first interlayer insulating layer 110.

Although the above-described embodiments of the inventive concept are applied to a NAND-type nonvolatile memory device, the technical spirit of the inventive concept may be applicable to other memory devices. For example, the embodiments of the inventive concept may be applicable to a NOR-type nonvolatile memory device. Furthermore, the embodiments of the inventive concept may be applicable to a volatile memory device, e.g., a DRAM.

A method of forming a semiconductor device according to an embodiment of the inventive concept will be described with reference to FIGS. 1A, 3A through 3C, 4A through 4C, 5A through 5C, 6A through 6C, 7A through 7C, and 8A through 8C.

FIGS. 3A, 4A, 5A, 6A, 7A, and 8A illustrate cross-sectional views of stages in a manufacturing method of a semiconductor device along line I-II of FIG. 1A. FIGS. 3B, 4B, 5B, 6B, 7B, and 8B illustrate cross-sectional views of stages in a manufacturing method of the semiconductor device along line III-IV of FIG. 1A. FIGS. 3C, 4C, 5C, 6C, 7C, and 8C illustrate cross-sectional views of stages in a manufacturing method of a semiconductor device along line V-VI of FIG. 1A. The details described with reference to FIGS. 1A and 8A through 8C will partially be omitted.

Referring to FIGS. 1A and 3A through 3C, the active regions ACT may be defined on the semiconductor substrate 100. The semiconductor substrate 100 may include the cell region, the core region, and the peripheral region. The active regions ACT may be defined by forming trenches in the semiconductor substrate 100 so as to extend in the first direction and filling the device isolation layer 102 in the trenches. The active regions ACT of the cell region and the core region may simultaneously be defined. The well regions may be formed by doping the first conductive-type dopants in the semiconductor substrate 100 before the trenches are formed.

Figure 3A:
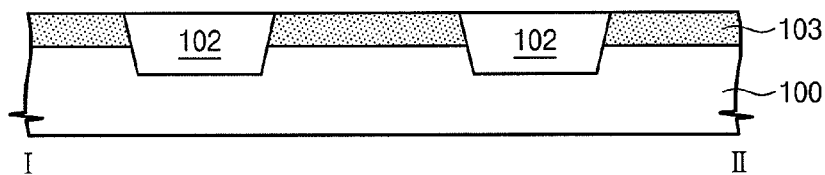
FIGS. 3A through 3C illustrate cross-sectional views of a stage in a manufacturing method of the semiconductor device taken along respective lines I-II, III-IV, and V-VI in FIGS. 1A and 2A.
Figure 3B:
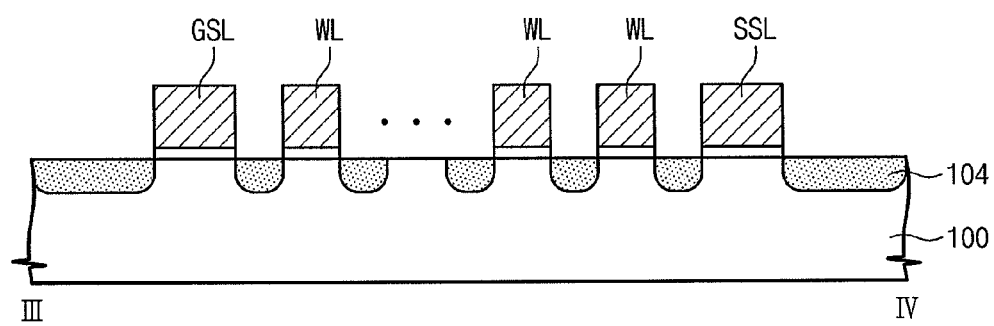
Figure 3C:
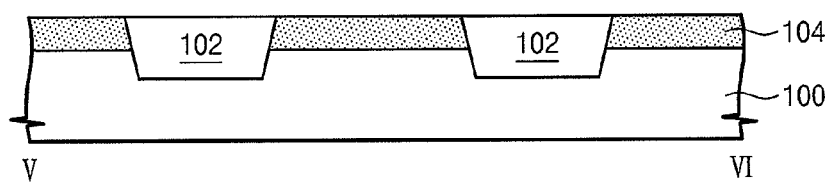

Gate lines GSL, WL, and SSL may be formed in the cell region of the semiconductor substrate 100. As illustrated in FIGS. 1A and 3B, the gate lines GSL, WL, and SSL may extend in the second direction which intersects with the first direction. The gate lines GSL, WL, and SSL may include the ground selection line GSL and the string selection line SSL, which are disposed at both edges, respectively, and a plurality of wordlines WL disposed between the ground selection line GSL and the string selection line SSL. A plurality of cell arrays may be disposed in the cell region, and the gate lines may be disposed in various ways according to kinds of selected memories.

The cell impurity regions 104 may be formed in the active regions ACT between the gate lines GSL, WL, and SSL. The cell impurity regions 104 may be formed by ion-implanting the second conductive-type dopants opposite to the first conductive-type dopants. During the ion implantation, the gate lines GSL, WL, and SSL may act as an ion implantation mask. One or more ion implantation may be performed.

Gate lines (not illustrated) and core impurity regions 103 may be formed in the core region. The gate lines and core impurity regions 103 of the core region may be formed at the same time as the gate lines (GSL, WL, and SSL) and cell impurity regions 104 in the cell region.

Figure 4A:
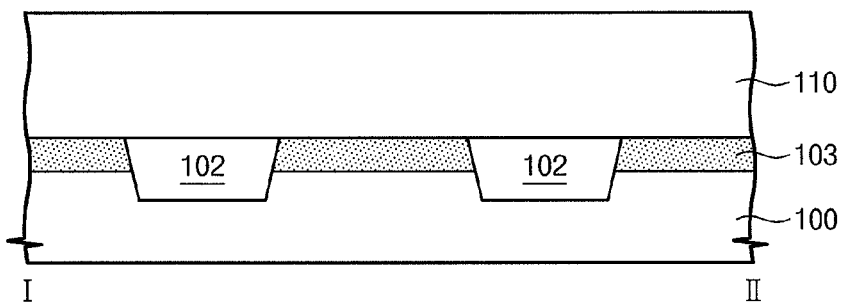
FIGS. 4A through 4C illustrate cross-sectional views of another stage in a manufacturing method of the semiconductor device taken along respective lines I-II, III-IV, and V-VI in FIGS. 1A and 2A.
Figure 4B:
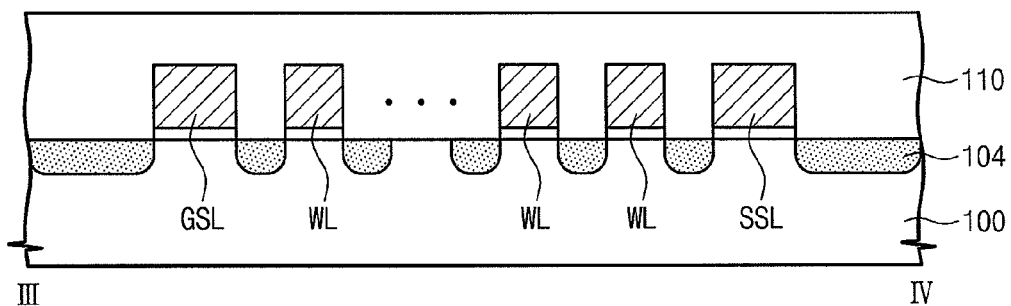
Figure 4C:
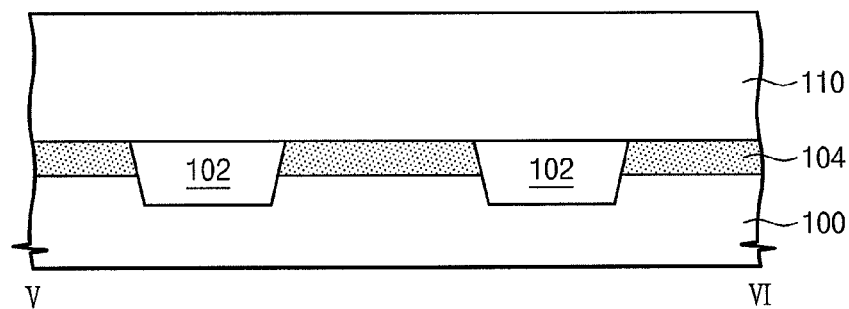

Referring to FIGS. 4A through 4C, the first interlayer insulating layer 110 may be formed on the semiconductor substrate 100 of the cell region and the core region. The first interlayer insulating layer 110 may cover the cell region, the gate lines of the core region, and the active regions ACT. The upper surface of the first interlayer insulating layer 110 may be planarized.

Figure 5A:
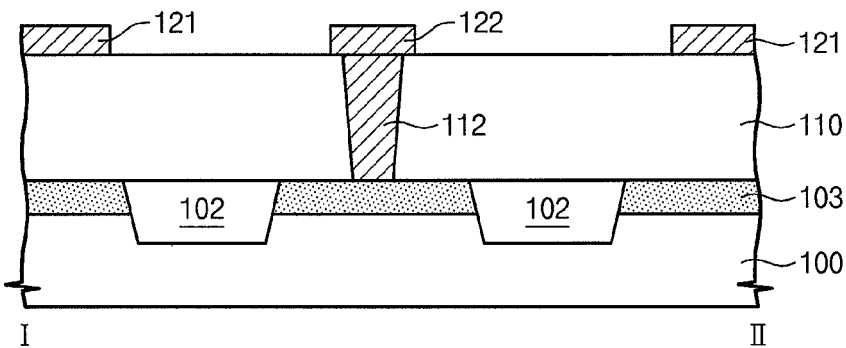
FIGS. 5A through 5C illustrate cross-sectional views of another stage in a manufacturing method of the semiconductor device taken along respective lines I-II, III-IV, and V-VI in FIGS. 1A and 2A.
Figure 5B:
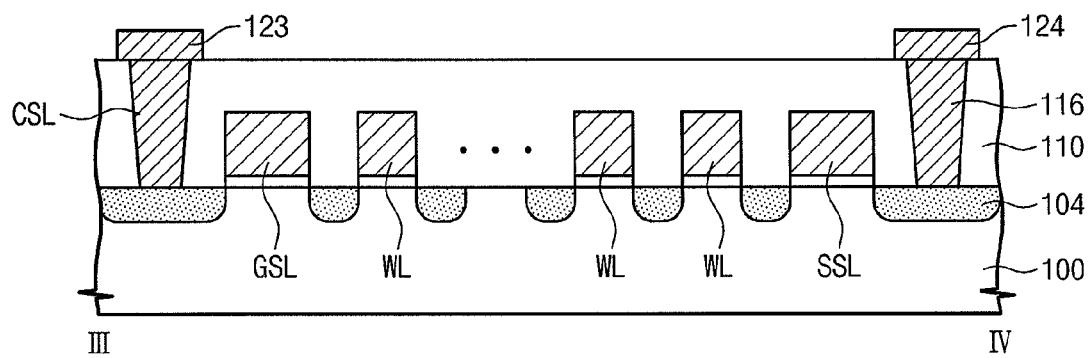
Figure 5C:
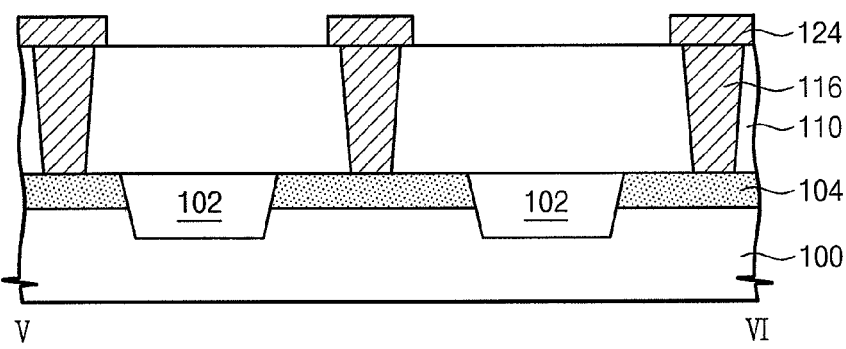

Referring to FIGS. 5A through 5C, the lower connection core contacts 112 may be formed in the core region to penetrate the first interlayer insulating layer 110. As illustrated in FIG. 5A, the lower connection core contacts 112 penetrate the first interlayer insulating layer 110. That is, after a hole is formed through the interlayer insulating layer 110 to expose the core impurity region 103, the lower connection core contact 112 may be formed by filling the hole with conductive materials. For example, the sidewalls of the lower connection core contacts 112 may be inclined downwardly, i.e., upper portions of the lower connection core contacts 112 may have a larger width than those of the lower portion of the lower connection core contacts 112. In another example, the lower connection core contacts 112 may have a uniform width in the upper portion and the lower portion.

The lower connection core contacts 112 may be formed so as to be electrically connected to the active regions ACT of the core region. The lower connection core contacts 112 may be arranged in a third direction nonparallel to the first and second directions. For example, lower connection core contacts 112 formed on adjacent active regions ACT, i.e., active regions ACT adjacent to each other in the second direction, may not be adjacent to each other in the first or second directions.

As illustrated in FIG. 5B, the common source line CSL and the lower bitline contacts 116 may be formed to penetrate the first interlayer insulating layer 110 in the cell region. The common source line CSL may be electrically connected to the impurity region 104 adjacent to the ground selection line GSL in the cell region, and the lower bitline contacts 116 may be electrically connected to the impurity region 104 adjacent to the string selection line SSL. As illustrated in FIG. 1A, the lower bitline contacts 116 may be arranged in the first direction.

In one embodiment of the inventive concept, the lower connection core contacts 112, the common source line CSL, and the lower bitline contacts 116 may be formed at the same time.

Contact pads 121, 122, 123, and 124 may be formed on the first interlayer insulating layer 110. For example, the connection contact pads 122 may be formed on the lower connection core contacts 112 of the core region, and the common source line contact pad 123 and the bitline contact pad 124 may be formed on the common source line CSL and the lower bitline contact 116 of the cell region, respectively. In addition, the dummy contact pads 121 may be formed on the first interlayer insulating layer 110 of the core region. The contact pads 121, 122, 123, and 124 may be formed at the same time. Alternatively, the contact pads 121, 122, 123, and 124 may be omitted.

Figure 6A:
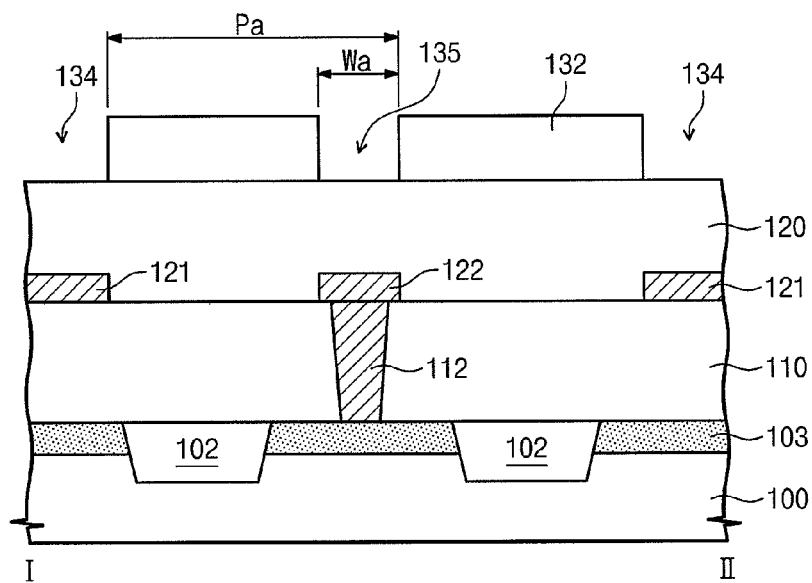
FIGS. 6A through 6C illustrate cross-sectional views of another stage in a manufacturing method of the semiconductor device taken along respective lines I-II, III-IV, and V-VI in FIGS. 1A and 2A.
Figure 6B:
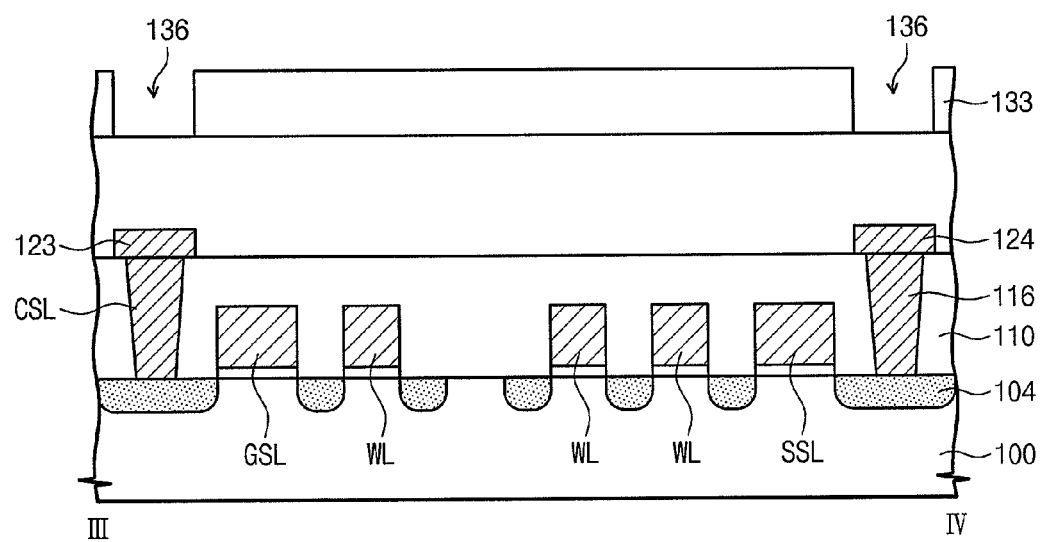
Figure 6C:
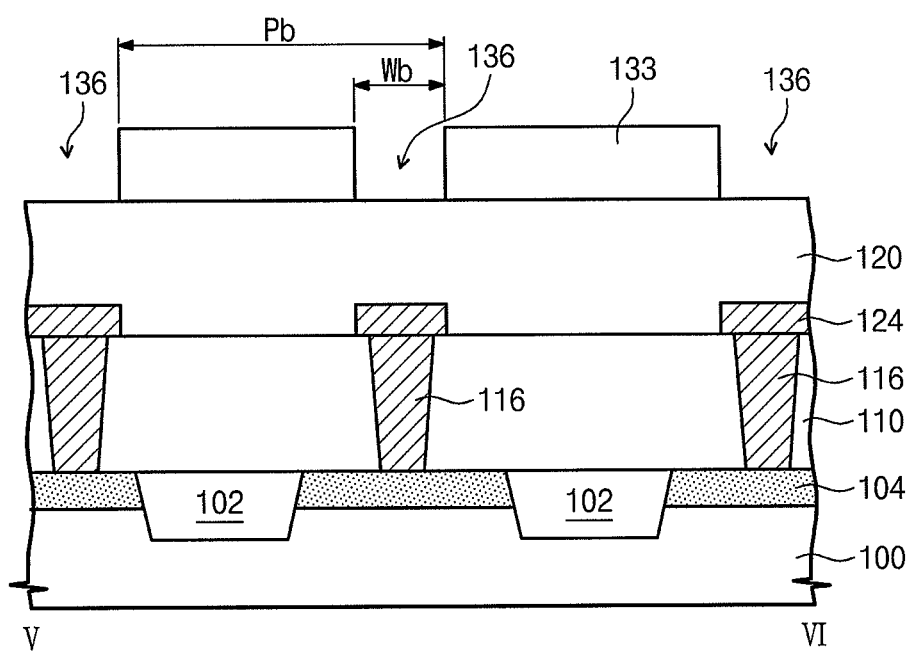

Referring to FIGS. 6A through 6C, the second interlayer insulating layer 120 may be formed on the first interlayer insulating layer 110. The second interlayer insulating layer 120 may cover the contact pads 121, 122, 123, and 124. The upper surface 120a of the second interlayer insulating layer 120 may be planarized.

A first mask pattern 132 may be formed on the second interlayer insulating layer 120 in the core region. The first mask pattern 132 in the core region may include core holes 134 and 135 having a predetermined width Wa in the second direction. The cross-section of the core holes 134 and 135, which are parallel to the plane of the second interlayer insulating layer 120, may be a circle, an oval, or a rounded rectangle. In one embodiment of the inventive concept, the width of the core holes 134 and 135 in the first direction may be larger than that of the core holes 134 and 135 in the first direction.

The core holes may include a connection hole 135 that exposes the upper surface of the second interlayer insulating layer 120 covering the connection contact pad 122. When the connection contact pad 122 is omitted, the connection hole 135 may expose the upper surface of the second interlayer insulating layer 120 covering the lower connection core contacts 112. In addition, the core holes may include dummy holes 134 that expose the upper surface of the second interlayer insulating layer 120 covering the dummy contact pads 121. When the dummy contact pads 121 are omitted, the dummy holes 134 may expose the upper surface of the second interlayer insulating layer 120 on a part of another active region ACT adjacent to the active region ACT, which is provided with the lower connection core contacts 112, in the second direction. The core holes 134 and 135 may be arranged at the first pitch Pa in the second direction.

A second mask pattern 133 may be formed on the second interlayer insulating layer 120 in the cell region, and may include cell holes 136 having a predetermined width Wb in the second direction (FIG. 6C). The cell holes 136 may expose the upper surface of the second interlayer insulating layer 120 that is disposed on the bitline contact pads 124. When the bitline contact pads 124 are omitted, the upper surface of the second interlayer insulating layer 120 covering the lower bitline contacts 116 may be exposed by the cell holes 136. The cross-section of the cell holes 136, which are parallel to the plane of the second interlayer insulating layer 120, may be a circle, an oval, or a rounded rectangle. In one embodiment of the inventive concept, the width Wb of the cell holes 136 in the second direction may be larger than that of the cell holes 136 in the first direction.

For example, the width Wb of the cell holes 136 in the second direction may substantially equal the width Wa of the core holes 134 and 135 in the second direction. In another example, the width Wa of the core holes 134 and 135 in the second direction may be larger than the width Wb of the cell holes 136 in the second direction. The cell holes 136 may be arranged at the second pitch Pb in the second direction. For example, the second pitch Pb may substantially equal the first pitch Pa at which the core holes 134 and 135 are disposed. In another example, the second pitch Pb may be smaller than the first pitch Pa.

The first mask pattern 132 in the core region and the second mask pattern 133 in the cell region may be a unitary mask pattern, i.e., a single integral mask, connected to each other. A method of forming the first mask pattern 132 in the core region and the second mask pattern 133 in the cell region will be described. A mask layer may be formed on the second interlayer insulating layer 120 in the cell region and the core region. A photoresist layer may be formed on the mask layer. A photoresist pattern may be formed by exposing and developing the photoresist layer. The photoresist pattern may have a substantially same shape as the mask patterns 132 and 133. The mask patterns 132 and 133 may be formed by etching the mask layer using the photoresist pattern as a mask.

After photo mask patterns are formed on the photoresist layer, the photoresist pattern may be formed by an exposure process using the photo mask patterns as an exposure mask. The photo mask patterns may include a pattern for forming the connection hole 135 in the mask pattern of the core region, a pattern for forming the dummy holes 134, and a pattern for forming the cell holes 136 of the cell region.

According to the embodiments of the inventive concept, a resolution of the exposure process for forming the connection hole 135 may be improved. In detail, the photoresist layer exposed between the photo mask patterns may be hardened or softened by the exposure process using the photo mask pattern. During the exposure process, since each of the patterns acts as an assist pattern to form the adjacent cell holes 136 of the cell region (that is, there are close-packed patterns), it may be possible to obtain high resolution.

In contrast, when the patterns are isolated from each other to foam a connection hole of the core region, i.e., when the photo mask pattern for forming the dummy holes is not formed, the resolution of the exposure process for forming the core region may be relatively deteriorated. While the photo mask pattern for forming the connection hole may be formed in an isolated pattern having a large width, the process margin may be reduced. Therefore, according to the embodiments of the inventive concept, since the photo mask pattern corresponding to the adjacent dummy holes 134 acts as an assist pattern in the exposure process for forming the connection hole 135, the resolution of the exposure process may be improved.

Figure 7A:
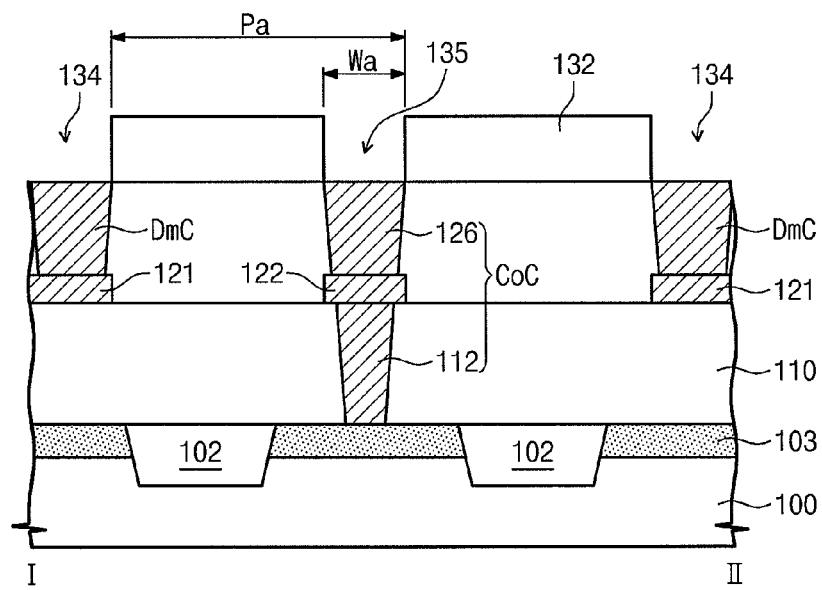
FIGS. 7A through 7C illustrate cross-sectional views of another stage in a manufacturing method of the semiconductor device taken along respective lines I-II, III-IV, and V-VI in FIGS. 1A and 2A.
Figure 7B:
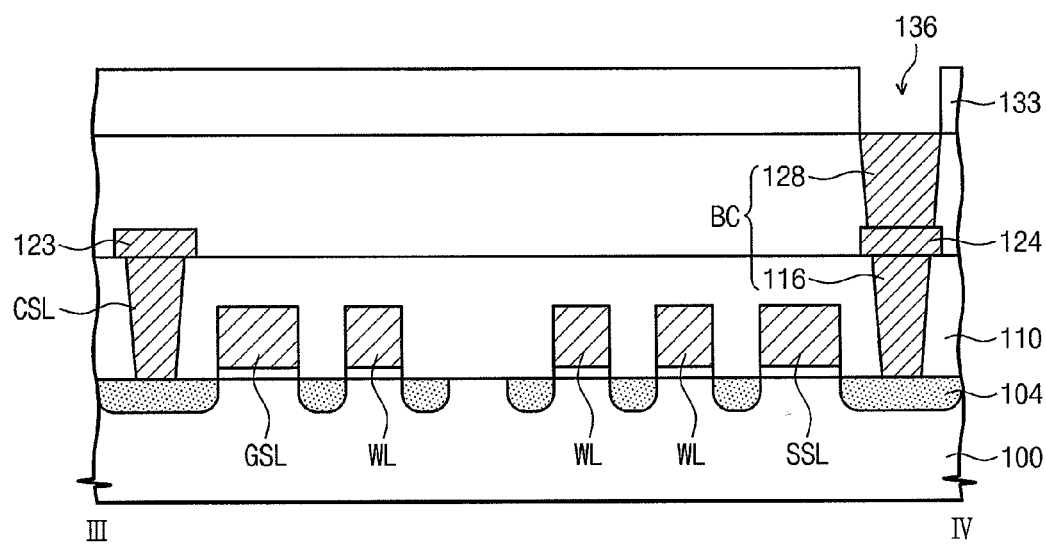
Figure 7C:
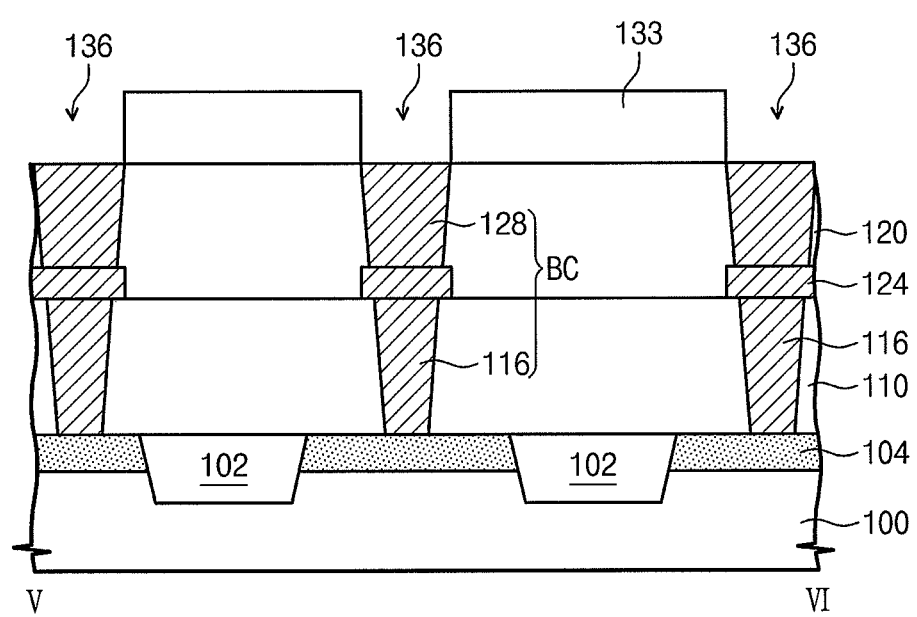

Referring to FIGS. 7A through 7C, holes may be formed to penetrated the second interlayer insulating layer 120 by an etching process using the mask patterns 132 and 133 as an etching mask. The second interlayer insulating layer 120 of the cell region and the core region may be etched at the same time.

Contacts may be formed in the holes of the cell region and the core region. The upper bitline contacts 128 may be formed in the second interlayer insulating layer 120 of the cell region, and the core contacts may be formed in the second interlayer insulating layer 120 of the core region. The upper bitline contacts 128 may be electrically connected to the active regions ACT through the lower bitline contacts 116. The core contacts may include the upper connection core contacts 126 and dummy contacts DmC. The upper connection core contact 126 may be electrically connected to the active region ACT, and the dummy contacts DmC may be insulated from the active regions ACT. The upper connection core contact 126 may be electrically connected to the active region ACT through the lower connection core contact 112. The dummy contacts DmC may be electrically and spatially isolated from the active region ACT by the first interlayer insulating layer 110.

Referring to FIGS. 8A through 8C, bitlines BL may be formed on the second interlayer insulating layer 120. The bitlines BL may make a connection between the bitline contact BC on the active regions ACT and the core contacts in the first direction. That is, the bitline contact BC formed on one active region ACT, the connection core contact CoC connected electrically to the one active region ACT, and the dummy contact DmC adjacent to the connection core contact CoC in the second direction may be connected to one another through the bitline BL extending along one active region ACT.

The semiconductor devices according to the above-described embodiments of the inventive concept may be realized in various types of semiconductor packages. For example, the semiconductor memory devices according to the embodiment of the inventive concept may be packaged in a package on package (PoP), ball grid array (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small-outline package (SSOP), thin small-outline (TSOP), thin quad flat pack (TQFP), system in package (SIP), multi chip package (MCP), wafer-level fabricated package (WFP), or wafer-level processed stack package (WSP). A package mounted with the semiconductor memory device according to the embodiments of the inventive concept may further include a controller and/or a logic device, for example, controlling the semiconductor memory device.

Figure 9:
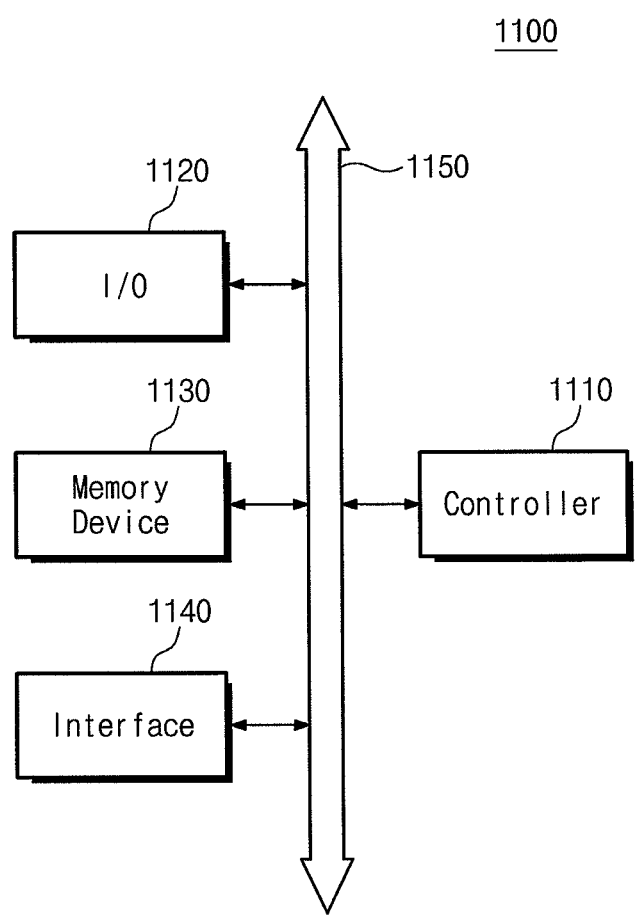
FIGS. 9 and 10 illustrate schematic views of systems including a semiconductor device according to embodiments.

FIG. 9 illustrates a block diagram of an electronic system including the semiconductor memory device according to embodiments of the inventive concept. Referring to FIG. 9, an electronic system 1100 according to the embodiment of the inventive concept may include a controller 1110, an input/output (I/O) device 1120, a memory device 1130, an interface 1140, and a bus 1150. The controller 1110, the I/O device 1120, the memory device 1130, and/or the interface 1140 may be connected to each other through the bus 1150. The bus 1150 corresponds to a transfer path of data.

The controller 1110 includes at least one of, e.g., a microprocessor, a digital signal processor, a microcontroller, and logic devices executing similar functions thereof. The I/O device 1120 may include, e.g., a key pad, a keyboard, or a display device. The memory device 1130 may store data and/or commands, and the like. The memory device 1130 may include at least one of the semiconductor memory devices disclosed in the above-described first and second embodiments of the inventive concept. The memory device 1130 may further include other types of semiconductor memory device, e.g., a flash memory device, a DRAM device, and/or an SRAM device. The interface 1140 executes a function of transmitting data to a communication network or receiving data from a communication network. The interface 1140 may be realized in a wireless or wired form. For example, the interface 1140 may include an antenna or a wireless/wired transceiver. Even though not illustrated, the electronic system 1100 may further include a high-speed DRAM and/or a high-speed SRAM as an operational memory for improving the operation of the controller 1110.

The electronic system 1100 is applicable to a personal digital assistant (PDA), a portable computer, a web tablet, a wireless phone, a mobile phone, a digital music player, a memory card, or any electronic device capable of transmitting and/or receiving information in a wireless environment.

Figure 10:
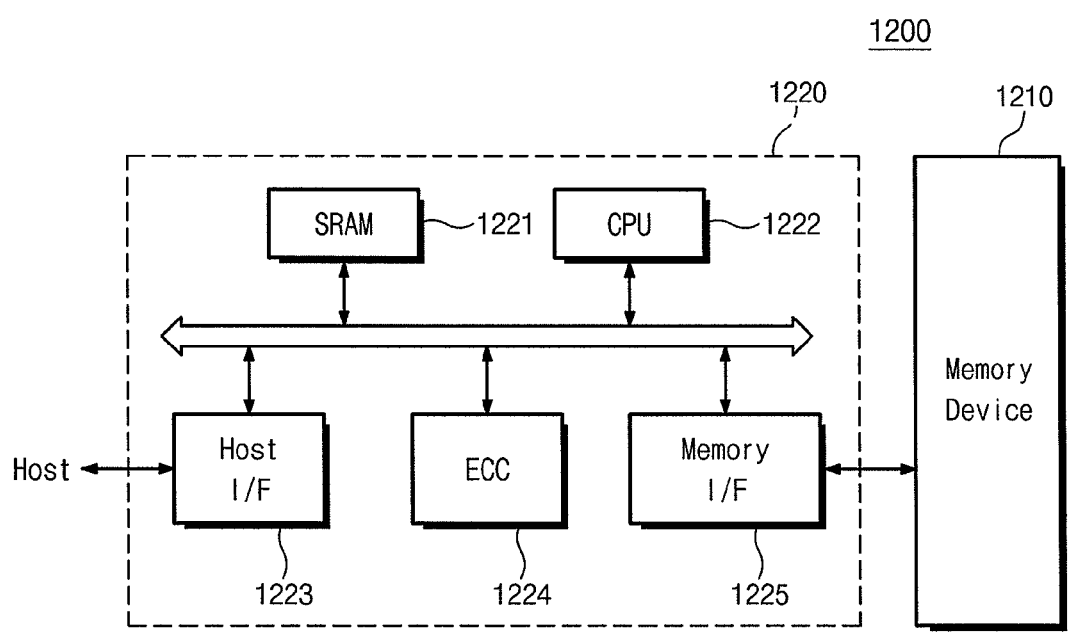

FIG. 10 illustrates a block diagram of a memory card including the semiconductor memory devices according to the embodiments of the inventive concept. Referring to FIG. 10, a memory card 1200 according to the embodiments of the inventive concept may include a memory device 1210. The memory device 1210 may include at least one of the semiconductor memory devices disclosed in the above-described embodiments. The memory card 1200 may include a memory controller 1220 controlling data exchange between a host and the memory device 1210.

The memory controller 1220 may include a processing unit 1222 generally controlling the memory card. The memory controller 1220 may include a SRAM 1221 used as an operational memory of the central processing unit (CPU) 1222. The memory controller 1220 may further include a host interface (I/F) 1223 and a memory I/F 1225. The host interface 1223 may have a protocol for exchanging data between the memory card 1200 and a host. The memory I/F 1225 may connect the memory controller 1220 to the memory device 1210. The memory controller 1220 may further include an error correction coding (ECC) block 1224. The ECC block 1224 may detect and correct an error of data read from the memory device 1210. Even though not illustrated, the memory card 1200 may further include a ROM device storing code data used to interface a host. The memory card 1200 may be used as a portable data storing card. Alternatively, the memory card 1200 may be realized as a solid state disk (SSD) replacing a hard disk drive of a computer system.

According to the embodiments of the inventive concept, the connection core contact making an electrical connection between the bitline of the core region and the active region and the core contact adjacent to the connection core contact may be disposed. The core contacts, including the dummy core contacts, may have the same width and pitch as the contacts of the cell region. Accordingly, the core contacts may be formed to have a higher process margin in the same area. As a result, the process stability may be improved, and higher integration of the device may be realized.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
    a semiconductor substrate including a cell region and a core region adjacent to the cell region;
    active regions in the cell region and the core region;
    an interlayer insulating layer covering the active regions;
    upper cell contacts penetrating the interlayer insulating layer in the cell region, the upper cell contacts being adjacent to each other along a first direction and being electrically connected to the active regions; and
    core contacts penetrating the interlayer insulating layer in the active regions of the core region, the core contacts being adjacent to each other along the first direction and including:
        upper connection core contacts electrically connected to the active regions, and
        dummy contacts adjacent to the upper connection core contacts, the dummy contacts being insulated from the active regions.

2. The semiconductor device as claimed in claim 1, further comprising at least one interconnection extending in a second direction substantially perpendicular to the first direction, the interconnection connecting the upper cell contacts to the core contacts.

3. The semiconductor device as claimed in claim 1, wherein:
the interlayer insulating layer includes a first interlayer insulating layer and a second interlayer insulating layer, the first and second interlayer insulating layers being sequentially stacked on the semiconductor substrate, and
the upper cell contacts and the core contacts penetrate the second interlayer insulating layer.

4. The semiconductor device as claimed in claim 3, further comprising lower cell contacts and lower connection core contacts penetrating the first interlayer insulating layer,
wherein the upper cell contacts are electrically connected to the active regions of the cell region through the lower cell contacts, and the upper connection core contacts are electrically connected to the active regions of the core region through the lower connection core contacts, and
wherein the dummy contacts are insulated from the active regions by the first interlayer insulating layer.

5. The semiconductor device as claimed in claim 4, wherein each upper surface of the upper cell contacts and the core contacts is coplanar with an upper surface of the second interlayer insulating layer, and each upper surface of the lower cell contacts is coplanar with an upper surface of the first interlayer insulating layer.

6. The semiconductor device as claimed in claim 4, further comprising contact pads between the first interlayer insulating layer and each of the upper cell contacts and the upper connection core contacts, each contact pad having a larger width than a width of a corresponding upper surface of a lower cell contact or a lower connection core contact.

7. The semiconductor device as claimed in claim 1, wherein each upper connection core contact is between two dummy contacts along the first direction.

8. The semiconductor device as claimed in claim 1, wherein the upper cell contacts are arranged at a first pitch in the first direction and the core contacts are arranged at a second pitch in the first direction, the second pitch being equal to or larger than the first pitch.

9. The semiconductor device as claimed in claim 1, wherein:
the active regions extend in a second direction substantially perpendicular to the first direction, the active regions being adjacent to each other along the first direction, and
a plurality of upper connection core contacts are positioned to contact the adjacent active regions, the upper connection core contacts being adjacent to each other along a third direction nonparallel to the first or second directions.

10. The semiconductor device as claimed in claim 1, wherein a cross-section of the upper cell contacts and the core contacts has a circular or an oval shape, the cross-section being along a plane parallel to a surface supporting the semiconductor substrate.

11. The semiconductor device as claimed in claim 1, wherein the upper cell contacts have a substantially same width in the first direction as the core contacts.

12. The semiconductor device as claimed in claim 1, wherein each upper surface of the upper cell contacts and the core contacts is coplanar with an uppermost surface of the interlayer insulating layer.

13. The semiconductor device as claimed in claim 1, further comprising:
contact pads in the interlayer insulating layer, each of the upper cell contacts and the upper connection core contacts being between a respective contact pad and an uppermost surface of the interlayer insulating layer; and
lower cell contacts and lower connection core contacts penetrating the interlayer insulating layer and connected to respective upper cell contacts and upper connection core contacts via the contact pads, each contact pad having a larger width than a width of a corresponding upper surface of a lower cell contact or a lower connection core contact.

14. The semiconductor device as claimed in claim 1, wherein each dummy contact is on a corresponding active region, a portion of the interlayer insulating layer separating each dummy contact from the corresponding active region.

15. The semiconductor device as claimed in claim 8, wherein the second pitch is equal to the first pitch.

* * * * *